(12) United States Patent
Niwa

(10) Patent No.: US 12,187,203 B2
(45) Date of Patent: Jan. 7, 2025

(54) WIRING MODULE AND POWER DISTRIBUTION APPARATUS HAVING THE SAME

(71) Applicant: DENSO CORPORATION, Kariya (JP)

(72) Inventor: Masato Niwa, Kariya (JP)

(73) Assignee: DENSO CORPORATION, Kariya (JP)

( * ) Notice: Subject to any disclaimer, the term of this patent is extended or adjusted under 35 U.S.C. 154(b) by 127 days.

(21) Appl. No.: 17/901,396

(22) Filed: Sep. 1, 2022

(65) Prior Publication Data

US 2022/0410825 A1 Dec. 29, 2022

Related U.S. Application Data

(63) Continuation of application No. PCT/JP2021/000596, filed on Jan. 11, 2021.

(30) Foreign Application Priority Data

Mar. 6, 2020 (JP) .................. 2020-039336

(51) Int. Cl.
| | |
|---|---|
| B60R 16/02 | (2006.01) |
| H02G 3/04 | (2006.01) |
| H02J 7/00 | (2006.01) |
| H02M 7/04 | (2006.01) |

(52) U.S. Cl.
CPC ......... *B60R 16/0215* (2013.01); *H02G 3/04* (2013.01); *H02J 7/00714* (2020.01); *H02M 7/04* (2013.01)

(58) Field of Classification Search
CPC ...... B60R 6/0207; B60R 6/0215; H02G 3/04; H02G 3/32; H02G 3/0437; H02G 3/045
See application file for complete search history.

(56) References Cited

U.S. PATENT DOCUMENTS

| | | | |
|---|---|---|---|
| 6,482,051 B1 * | 11/2002 | Ide ..................... | H01R 43/0207 439/604 |
| 6,685,259 B1 * | 2/2004 | Shimase .............. | B62D 25/145 296/72 |
| 10,535,959 B2 * | 1/2020 | Copper .............. | H01R 13/6599 |
| 11,427,260 B2 * | 8/2022 | Yamaguchi ......... | B60R 16/0215 |
| 2005/0217888 A1 * | 10/2005 | Arai ..................... | H02G 3/0418 174/72 A |
| 2014/0090867 A1 * | 4/2014 | Kelly ..................... | H02G 1/08 174/97 |
| 2018/0301983 A1 | 10/2018 | Okazaki et al. | |
| 2020/0006927 A1 * | 1/2020 | O'Shaughnessy ... | H02G 3/0437 |
| 2022/0161742 A1 * | 5/2022 | Saito ...................... | H02G 3/04 |

FOREIGN PATENT DOCUMENTS

| | | |
|---|---|---|
| JP | 2009-295517 A | 12/2009 |
| JP | 2015-207751 A | 11/2015 |
| JP | 2019-149909 A | 9/2019 |

\* cited by examiner

Primary Examiner — Paresh Paghadal
(74) Attorney, Agent, or Firm — Oliff PLC

(57) ABSTRACT

A low voltage signal line and a high voltage signal line are connected to a power distribution ECU which controls charging and discharging of an assembled battery. A base portion and a shield member are interposed between the low voltage signal line and the high voltage signal line having different applied voltages. These signal lines and the base are connected by a connecting member.

2 Claims, 8 Drawing Sheets though the following embodiments each has such a structure, a configuration, a step, a shape, and the like, the embodiments of the present disclosure are not limited to the structure, the configuration, the step, the shape, and the like. Numerical values, quantities, amounts, ranges, and the like of the embodiments are not limited to those exemplified unless otherwise specified or unless theoretically limited to the particular values. In addition, an element described with a modifier such as "a", "one", or "the" does not necessarily exclude a plurality of the elements.

WIRING MODULE AND POWER DISTRIBUTION APPARATUS HAVING THE SAME

CROSS REFERENCE TO RELATED APPLICATIONS

The present application is a continuation application of International Patent Application No. PCT/JP2021/000596 filed on Jan. 11, 2021, which designated the U.S. and claims the benefit of priority from Japanese Patent Application No. 2020-039336 filed in Japan on Mar. 6, 2020, and the content of the basic application is incorporated by reference in its entirety.

TECHNICAL FIELD

The disclosure described herein relates to a wiring module and a power distribution apparatus having the wiring module.

BACKGROUND

An electric apparatus has many electric lines applied with different voltages. For example, a power distribution apparatus for controlling power distribution to an electric motor for a vehicle has power lines applied with a high voltage for the electric motor and signal lines applied with a low voltage. There may be an unintentional current path or an unintentional electromagnetic coupling in the apparatus. In the above aspects, or in other aspects not mentioned, there is a need for further improvements in wiring module and a power distribution apparatus having the wiring module.

SUMMARY

A wiring module, according to an embodiment of the disclosure, comprises: a first insulated wire and a second insulated wire of which applied voltage is higher than the first insulated wire, electrically connected to the control unit which performs controls for charging and discharging of the in-vehicle power source; an intervening member which is interposed between the first insulated wire and the second insulated wire; and a connecting member which connects the first insulated wire, the second insulated wire, and the intervening portion.

The power distribution apparatus according to an embodiment of the disclosure, comprises: a control unit which performs controls for charging and discharging of the in-vehicle power supply; a wiring module which is electrically connected to the control unit; a power transform device which is driven under control of the control unit; and a housing which accommodates the control unit, the wiring module, and the power conversion device, wherein the wiring module includes: a first insulated wire which is electrically connected to the control unit; a second insulated wire which is applied with a higher voltage than the first insulated wire; an intervening member which is interposed between the first insulated wire and the second insulated wire; and a connecting member connects the first insulated wire, the second insulated wire, and the intervening member.

According to the present disclosure, it is possible to suppress a formation of an unintentional current path by an electrical connection between the first insulated wire and the second insulated wire. As a result, unintentional current flow is suppressed in the control unit to which the first insulated wire and the second insulated wire are connected.

DETAILED DESCRIPTION

Figure 1:
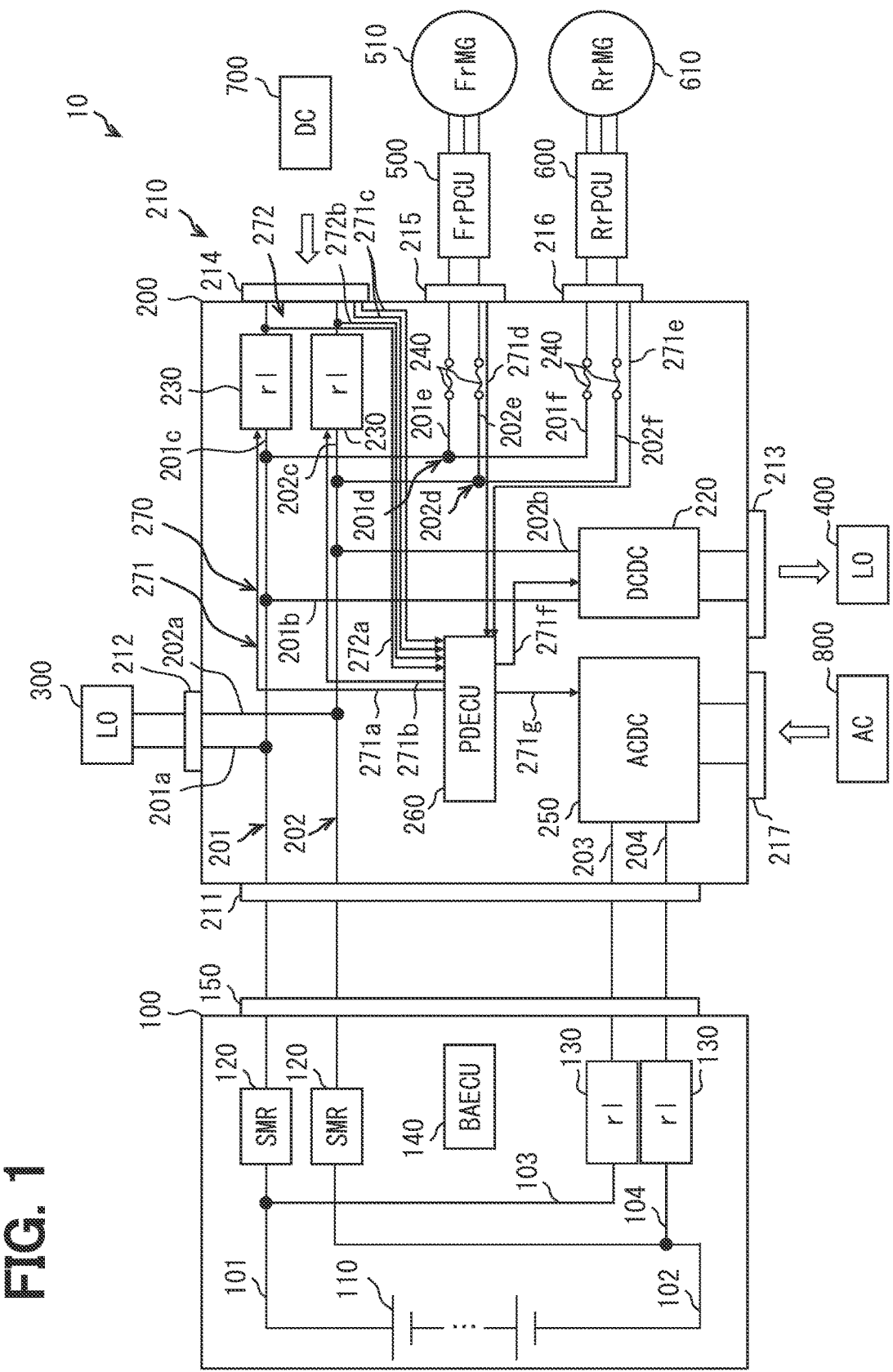
FIG. 1 is a circuit diagram for explaining a power supply system.

The following will describe embodiments for carrying out the present disclosure with reference to the drawings. In each embodiment, parts corresponding to the elements described in the preceding embodiments are denoted by the same reference numerals, and redundant explanation may be omitted. When only a part of a configuration is described in an embodiment, the other preceding embodiments can be applied to the other parts of the configuration.

When, in each embodiment, it is specifically described that combination of parts is possible, the parts can be combined. In a case where any obstacle does not especially occur in combining the parts of the respective embodiments, it is possible to partially combine the embodiments, the embodiment and the modification, or the modifications even when it is not explicitly described that combination is possible.

As shown in JP5936745B, a power transform device including a signal line connector, a charging/DCDC controller, and a relay controller is known. JP5936745B includes a signal line connecting a signal line connector and a charging/DCDC controller, and a signal line connecting a charging/DCDC controller and a relay controller.

In the case that a plurality of signal lines are bundled in this way, there is a possibility that an unintentional current path may be formed due to contacts of conductive portions of the plurality of signal lines. In particular, when a plurality of signal lines having different applied voltages are conducted, an abnormal current may flow in an unintentional current path.

It is an object of the present disclosure to provide a wiring module and a power distribution apparatus including the wiring module in which an unintentional current path is suppressed.

First Embodiment

The power distribution apparatus and the wiring module included in the power distribution apparatus according to the present embodiment is described with reference to FIGS. 1 to 4. The power distribution apparatus is applied to an electric vehicle such as a full electric powered vehicle and a plug-in hybrid vehicle. In this embodiment, a configuration in which the power distribution apparatus is applied to an electric vehicle is described as an example.

<Power Supply System> As shown in FIG. 1, the power distribution apparatus 200 is included in a vehicle power supply system 10. In addition to the power distribution apparatus 200, the power supply system 10 includes a battery pack 100, a first vehicle load 300, a second vehicle load 400, a front PCU 500, a front MG 510, a rear PCU 600, and a rear MG 610. Further, the power supply system 10 includes a vehicle-mounted ECU and a vehicle-mounted sensor (not shown). The power supply system 10 is capable of being connected to a DC power source 700 and/or an AC power source 800.

PCU is an abbreviation for Power Control Unit. MG is an abbreviation of Motor Generator. In the drawing, each of the first vehicle-mounted load 300 and the second vehicle-mounted load 400 is shown as LO. The front PCU 500 is shown as FrPCU. The front MG 510 is shown as FrMG. The rear PCU 600 is shown as RrPCU. The rear MG 610 is shown as RrMG. The DC power source 700 is shown as DC. The AC power supply 800 is shown as AC.

The battery pack 100 and the power distribution apparatus 200 are electrically connected to each other in the vehicle via a wire harness or the like, which is provided as a power supply path. The first vehicle load 300 and the second vehicle load 400 are electrically connected to the power distribution apparatus 200 via a wire harness or the like. Further, the front PCU 500 and the rear PCU 600 are electrically connected to the power distribution apparatus 200 via a wire harness or the like. The front MG 510 is electrically connected to the front PCU 500. The rear MG 610 is electrically connected to the rear PCU 600.

Due to the electrical connection configuration described above, a DC power output from the battery pack 100 is supplied to the first vehicle load 300 and the second vehicle load 400 via the power distribution apparatus 200. Further, this DC electric power is supplied to the front PCU 500 and the rear PCU 600.

Each of the front PCU 500 and the rear PCU 600 includes an inverter circuit and/or a converter circuit for performing power transformation. Each of the front PCU 500 and the rear PCU 600 converts a supplied DC electric power into an AC electric power. On the contrary, each of the front PCU 500 and the rear PCU 600 converts a supplied AC electric power into a DC electric power.

The front MG 510 and the rear MG 610 are motor generators for traveling the vehicle to make the vehicle running. The front MG 510 and the rear MG 610 are powered by the AC electric power supplied from the front PCU 500 and the rear PCU 600. The front MG 510 generates power to rotate a front wheel of the vehicle. The rear MG 610 generates power to rotate a rear wheel of the vehicle.

At least one of the front MG 510 and the rear MG 610 regenerates power by the propulsive force of the vehicle. The AC electric power generated by this regenerative power generation is converted into a DC electric power by the front PCU 500 and the rear PCU 600. The DC power is supplied to the first vehicle load 300 and the second vehicle load 400 via the power distribution apparatus 200. Further, the DC power is supplied to the battery pack 100 via the power distribution apparatus 200.

Hereinafter for convenience, the DC electric power supplied from the battery pack 100 is referred to as a vehicle-mounted power. The electric power generated by the regenerative power generation and converted into the DC electric power by the front PCU 500 and the rear PCU 600 is referred to as a regenerative electric power.

The first vehicle load 300 may be, for example, a heater mounted on the vehicle, an air-conditioning device, and an external load, which is capable of being connected to an outlet of the vehicle. The power from the power source and the regenerative power are supplied to the first vehicle load 300 via the power distribution apparatus 200. Further, as is described later, in the case that a power source from an outside is connected to the power distribution apparatus 200, a charging electric power is supplied to the first vehicle load 300.

As shown in FIG. 1, the power distribution apparatus 200 includes a DCDC converter circuit 220. The DCDC converter circuit 220 is supplied with the vehicle-mounted power, the regenerative electric power, and the charging electric power. The DCDC converter circuit 220 steps down supplied electric power to 12V and supplies it to the second vehicle load 400. The second vehicle load 400 is, for example, a speaker, a power window, a power steering device, and the like.

The DC power source 700 from the outside may be connected to the power distribution apparatus 200. A DC charging electric power output from the DC power source 700 is supplied to the battery pack 100, the first vehicle load 300, and the DCDC converter circuit 220. As a result, the battery pack 100 is charged. The charging electric power is supplied to the first vehicle load 300, and 12V DC electric power is supplied from the DCDC converter circuit 220 to the second vehicle load 400.

The power distribution apparatus 200 includes an ADCC converter 250. The AC power source 800 is connected to the ACDC converter 250 from the outside. The ACDC converter 250 converts the AC power supplied from the AC power source 800 into DC power. This DC electric power is supplied to the battery pack 100 as a charging electric power. As a result, the battery pack 100 is charged. The charging electric power is also supplied to the first vehicle load 300 and the DCDC converter circuit 220 by controlling a system power relays 120 described later. The DCDC converter 220 and the ADCC converter 250 correspond to the power transform device.

As described above, the power distribution apparatus 200 performs a function of supplying the electric power from both the power outputted in the vehicle and the regenerative power to various electric devices mounted on the vehicle. The power distribution apparatus 200 performs a function of supplying charging power supplied from an external power source to various electric devices mounted on the vehicle. Hereinafter, components included in the battery pack 100 and the power distribution apparatus 200 are described.

<Battery Pack> The battery pack 100 includes an assembled battery 110, system main relays 120, power relays 130, a battery ECU 140, and a battery connector 150. The battery ECU 140 controls each of operation of the SMRs 120 and the power relays 130. Outputs of the assembled battery 110 to a side to the battery connector 150 are controlled to be connected and disconnected by operating the SMRs 120 and the power relays 130.

In the drawing, the power relay 130 is shown as rl. The battery ECU 140 is shown as a BAECU.

The assembled battery 110 has a plurality of battery cells connected in series. A voltage corresponding to a potential difference between a positive terminal of the battery cell having the highest potential and a negative terminal of the battery cell having the lowest potential among the plurality of battery cells connected in series corresponds to a power source voltage of the assembled battery 110. As the battery cell included in the assembled battery 110, a secondary battery such as a lithium ion battery can be adopted. The assembled battery 110 corresponds to an in-vehicle power source.

One end of a first power source line 101 is connected to a positive terminal of the battery cell located at the highest potential among the plurality of battery cells connected in series. One end of a second power source line 102 is connected to a negative terminal of the battery cell located at the lowest potential. The other ends of the first power source line 101 and the second power line 102 are provided in the battery connector 150.

The power relays 130 are provided in the third power source line 103 and the fourth power source line 104, respectively. The SMRs 120 are mechanical switch elements. The SMRs 120 are normally close type switch elements that are turned off by inputting drive signals from the battery ECU 140 and turned on by interrupting the drive signals. The SMR is an abbreviation for System Main Relay.

One end of the third power source line 103 is connected to an intermediate point between the assembled battery 110 and the SMR 120 in the first power source line 101. One end of the fourth power source line 104 is connected to an intermediate point between the assembled battery 110 and the SMR 120 in the second power source line 102. The other ends of the third power source line 103 and the fourth power source line 104 are provided in the battery connector 150.

The power relays 130 are provided in the third power source line 103 and the fourth power source line 104, respectively. The power relays 130 are mechanical switch elements. The power relays 130 are normally open type switch elements that are turned on by inputting drive signals from the battery ECU 140 and turned off by interrupting the drive signals.

The battery ECU 140 performs communication with the other vehicle-mounted ECUs and the power distribution ECU 260 described later via wiring (not shown). The battery ECU 140 controls operations of the SMR 120 and the power relay 130 based on the vehicle signal including the communication with these ECUs and the vehicle information input from the vehicle-mounted sensor and the like.

As described above, the battery connector 150 is provided with the other ends of the first to fourth power source lines 101 to 104. The control of energization and disconnection of the assembled battery 110 on the other end side of each of these four power source lines are performed by an output and non-output of the drive signal from the battery ECU 140 to the SMRs 120 and the power relays 130. The other ends of these four power source lines are connected to the power distribution apparatus 200.

<Power Distribution Apparatus> The power distribution apparatus 200 includes a distribution connector 210, a DCDC converter 220, a DC relay 230, a fuse 240, and an ACDC converter 250. Further, the power distribution apparatus 200 has a power distribution ECU 260 and a wiring module 270.

In the drawings, the DCDC converter 220 is shown as DCDC. The DC relay 230 is shown as rl. The ACDC converter 250 is shown as ACDC. The power distribution ECU 260 is shown as a PDECU. Further, in FIG. 1, the signal line included in the wiring module 270 is shown by a solid arrow.

The distribution connector 210 includes a power source connector 211, a first load connector 212, a second load connector 213, a DC power connector 214, a front connector 215, a rear connector 216, and an AC power connector 217.

The power source connector 211 is provided with one ends of the first to fourth power lines 201 to 204. The battery connector 150 of the battery pack 100 is capable of being connected to the power source connector 211.

One end of the first power line 201 is connected with the other end of the first power source line 101. One end of the second power line 202 is connected with the other end of the second power source line 102. As a result, when the SMRs 120 of the assembled battery 110 are turned on, both the first power line 201 and the second power line 202 are electrically connected to the assembled battery 110. Contrary, when the SMRs 120 are turned off, the electrical connections between the assembled battery 110 and both the first power line 201 and the second power line 202 are disconnected.

The other end side of the first power line 201 is branched into four, a first positive electrode line 201a, a second positive electrode line 201b, a third positive electrode line 201c, and a fourth positive electrode line 201d. The other end side of the second power line 202 is branched into four, a first negative electrode line 202a, a second negative electrode line 202b, a third negative electrode line 202c, and a fourth negative electrode line 202d.

The distal ends of the first positive line 201a and the first negative line 202a are provided in the first load connector 212. As a result, when the SMRs 120 are turned on, the assembled battery 110 and the first vehicle load 300 are electrically connected.

The distal ends of the second positive line 201b and the second negative line 202b are provided in the second load connector 213. The DCDC converter circuit 220 is provided on the second positive line 201b and the second negative line 202b. As a result, when the electric power is supplied to the DCDC converter circuit 220, 12V DC electric power is supplied to the second vehicle load 400.

The distal ends of the third positive line 201c and the third negative line 202c is provided in the DC power connector 214. The DC relays 230 are provided on the third positive line 201c and the third negative line 202c, respectively. As a result, when the DC relays 230 are turned on, the first vehicle load 300 and the DCDC converter circuit 220 are electrically connected to the DC power source 700. Further, when the SMRs 120 are turned on, the assembled battery 110 is electrically connected to the DC power source 700.

The DC relays 230 are mechanical switch elements. The DC relays 230 are normally open type switch elements which are turned on by inputting drive signals from the power distribution ECU 260 and turned off by interrupting the drive signals.

The fourth positive line 201d is branched into two, a positive front line 201e and a positive rear line 201f. The fourth negative line 202d is branched into two, a negative front line 202e and a negative rear line 202f. The fuses 240 are provided on these four lines, respectively.

Distal ends of the positive front line 201e and the negative front line 202e are provided in the front connector 215. The front PCU 500 is connected to the front connector 215. As a result, the first vehicle load 300 and the DCDC converter circuit 220 are each electrically connected to the front PCU 500. When the SMRs 120 are turned on, the assembled battery 110 and the front PCU 500 are electrically connected.

Distal ends of the positive rear line 201f and the negative rear line 202f are provided in the rear connector 216. The rear PCU 600 is connected to the rear connector 216. As a result, the first vehicle load 300 and the DCDC converter circuit 220 are each electrically connected to the rear PCU 600. When the SMRs 120 are turned on, the assembled battery 110 and the rear PCU 600 are electrically connected.

One end of the third power line 203 is connected to the other end of the third power source line 103. One end of the fourth power line 204 is connected to the other end of the fourth power source line 104. As a result, when the power relays 130 of the assembled battery 110 are turned on, the third power line 203 and the fourth power line 204 are electrically connected to the assembled battery 110. When the power relays 130 are turned off, the electrical connections between the assembled battery 110 and both the third power line 203 and the fourth power line 204 are disconnected.

The ACDC converter 250 is provided on the third power line 203 and the fourth power line 204. The other ends of the third power line 203 and the fourth power line 204 are provided in the AC power connector 217. The AC power source 800 may be connected to the AC power connector 217 from the outside. As a result, when the power relay 130 is turned on, the assembled battery 110 and the AC power source 800 are electrically connected via the ACDC converter 250.

The power distribution ECU 260 is electrically connected to the DCDC converter 220, the DC relay 230, and the ADCC converter 250 via the signal line in the wiring module 270. Further, the power distribution ECU 260 performs communication with the in-vehicle ECU and the battery ECU 140 via wiring (not shown). The wiring module 270 is described in detail later.

The power distribution ECU 260 controls operations of the DCDC converter 220, the DC relay 230, and the ADCC converter 250 based on vehicle signals including vehicle information input from communication with these ECUs and in-vehicle sensors (not shown). The power distribution ECU 260 corresponds to a control unit.

As described above, the DC power source 700 and the AC power source 800 are connected to the power distribution apparatus 200 as external power sources. In the case that these external power sources are, for example, an electric power charging station, the power distribution ECU 260 performs communication with a CPU included in the electric power charging station. The power distribution ECU 260 outputs this communication result to the vehicle-mounted ECUs and the battery ECU 140. The power distribution ECU 260 controls operations of the DCDC converter 220, the DC relay 230, and the ADCC converter 250 based on the communication result and the vehicle information. Similarly, the battery ECU 140 controls operations of the SMRs 120 and the power relays 130 based on the communication result and the vehicle information.

<Operation of Power Supply System> The operation of the power supply system 10 is described below.

The battery ECU 140 turns on the SMRs 120 at a normal condition which includes such as a parked or stopped condition of the vehicle or a normal running condition of the vehicle. Further, the battery ECU 140 turns off the power relays 130. The power distribution ECU 260 turns off the DC relays 230.

As a result, the electric power of the assembled battery 110 is supplied to the first vehicle load 300, the DCDC converter circuit 220, the front PCU 500, and the rear PCU 600. Contrary, the regenerative electric power of the front MG 510 and the rear MG 610 are supplied to the first vehicle load 300, the DCDC converter circuit 220, and the assembled battery 110.

In a DC charging condition, in which the DC power source 700 is connected to the power distribution apparatus 200 in a parked or stopped condition, the battery ECU 140 turns on the SMRs 120. Further, the battery ECU 140 turns off the power relays 130. The power distribution ECU 260 turns on the DC relays 230.

As a result, the DC electric power supplied from the DC power source 700 is supplied to the assembled battery 110, the first vehicle load 300, and the DCDC converter circuit 220. As a matter of course, the amount of electric power supplied to the first vehicle-mounted load 300 is determined according to a required power of the first vehicle-mounted load 300.

In an AC charging condition, in which the AC power source 800 is connected to the power distribution apparatus 200 in a parked or stopped condition, the battery ECU 140 turns on the SMRs 120 and the power relays 130, respectively. The power distribution ECU 260 turns off the DC relays 230.

As a result, the AC power supplied from the AC power source 800 is converted into DC power by the ACDC converter 250. This DC power is supplied to the assembled battery 110, the first vehicle load 300, and the DCDC converter circuit 220. Even during this AC charging, as a matter of course, the amount of electric power supplied to the first vehicle-mounted load 300 is determined according to the required power of the first vehicle-mounted load 300.

Figure 2:
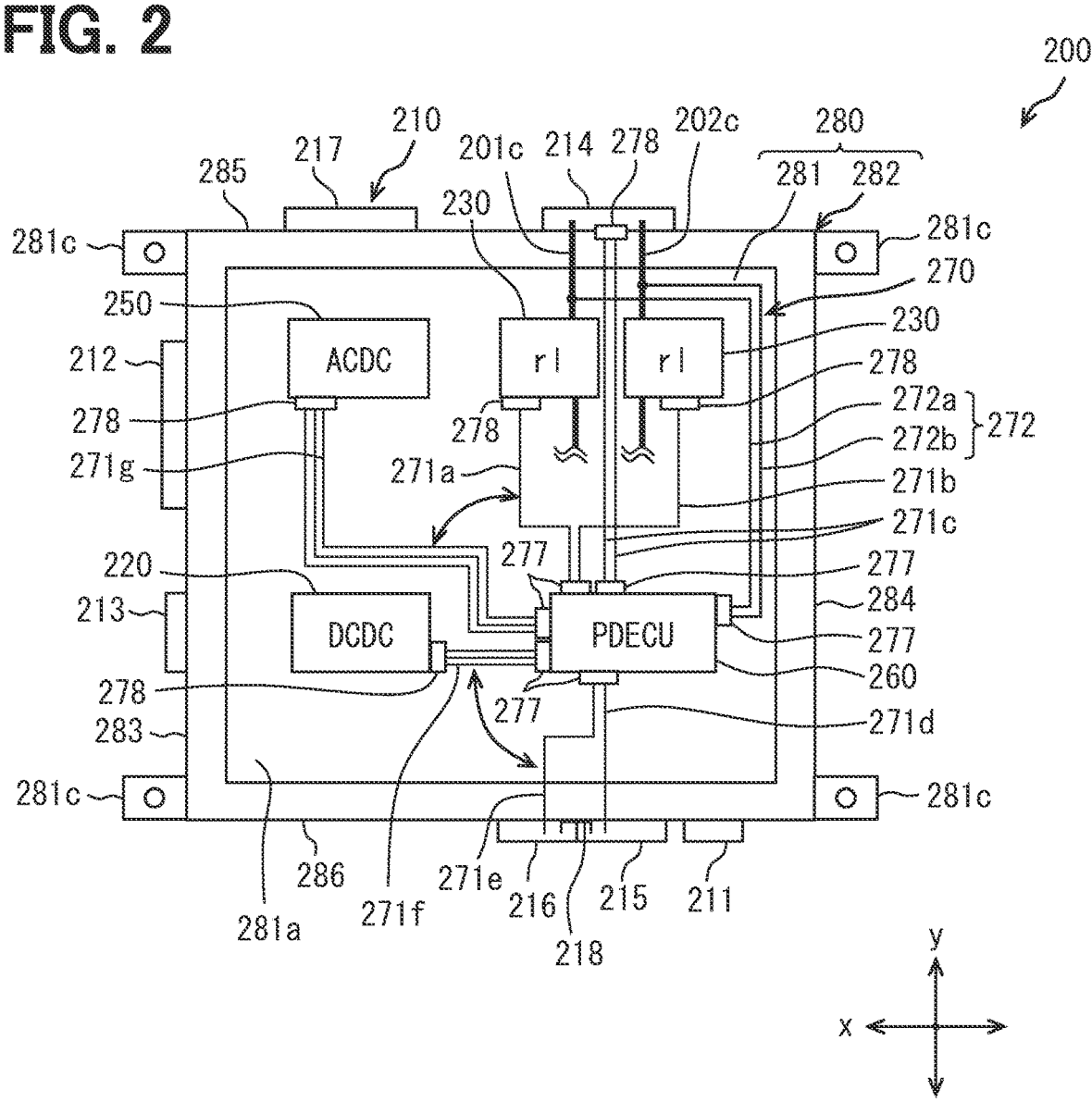
FIG. 2 is a schematic diagram for explaining a signal line.

<Structure of Power Distribution Apparatus> Next, the configuration of the power distribution apparatus 200 is described with reference to FIG. 2. Note that FIG. 2 schematically shows the configuration of the power distribution apparatus 200. The fuse 240 is not shown. The drawing illustrates only a side to the DC power connector 214 of the third positive line 201c and the third negative line 202c among the plurality of power lines.

In the following, the three directions orthogonal to each other are referred to as a "x" direction, a "y" direction, and a "z" direction. In the drawings, the description of "direction" is omitted, and the description is simply x, y, z. One of the "x" direction and the "y" direction corresponds to a left and right direction of the vehicle, and the other one corresponds to a forward and reverse direction of the vehicle. The "z" direction corresponds to a top and bottom direction of the vehicle. When the vehicle is parked on a horizontal plane, the z-direction is along the vertical direction.

In addition to the electrical equipment described so far, the power distribution apparatus 200 has a housing 280 shown in FIG. 2 and a lid (not shown) that closes an opening of the housing 280. The housing 280 has a bottom wall 281 having a thin thickness in the z-direction and a side wall 282 that rises in an annular shape in the z-direction from the inner bottom surface 281a of the bottom wall 281.

The outer bottom surface on the back side of the inner bottom surface 281a is provided on a side to an underbody of the vehicle in the z-direction with respect to the inner bottom surface 281a. A flange portion 281c for bolting the power distribution apparatus 200 to the underbody is integrally connected to the bottom wall 281 provided with the outer bottom surface.

The side wall 282 has a left wall 283 and a right wall 284 arranged apart from each other in the x-direction, and a front wall 285 and a rear wall 286 arranged apart from each other in the y-direction. The side wall 282 forms an annular shape by connecting these four walls side by side in the circumferential direction around the z-direction.

The side wall 282 is formed with a notch, a hole, or the like for providing the distribution connector 210. As shown in FIG. 2, a first load connector 212 and a second load connector 213 are provided on the left wall 283. The DCDC converter 220 and the ACDC converter 250 are located on a side to the left wall 283 in the x-direction in order to reduce the separation distance from these connectors.

The DC power, connector 214 and the AC power connector 217 are provided on the front wall 285. The DC power connector 214 is located on a side to the right wall 284 more than the AC power connector 217 in the x-direction. In order to reduce a distance from the DC power connector 214, the DC relay 230 is located on a side to the front wall 285 in the y-direction and on a side to the right wall 284 in the x-direction.

The power connector 211, the front connector 215, and the rear connector 216 are provided on the rear wall 286. These three connectors are located on a side to the right wall 284 in the x-direction. These three connectors are arranged side by side in the x-direction.

The power distribution ECU 260 is located on a side to the right wall 284 in the x-direction and on a side to the rear wall 286 in the y-direction. Signal lines provided in the wiring module 270 are connected to the power distribution ECU 260.

<Wiring Module> Next, the wiring module 270 is described with reference to FIGS. 2 to 4. The wiring module 270 has a low voltage signal line 271, a high voltage signal line 272, a wiring case 273, and a connecting member 274.

The low voltage signal line 271 and the high voltage signal line 272 are each insulated wires. As shown in FIG. 4, each of these two types of signal lines has a conductive wiring 275 and an insulating film 276 covering the conductive wiring 275. These two types of signal lines may have the same or different diameter.

Low voltage of about 0V, 5V, or 12V is applied to the low voltage signal line 271. High voltage of about 200V to 400V is applied to the high voltage signal line 272 according to the potential difference between the positive electrode line and the negative electrode line. As described above, the voltage applied to the high voltage signal line 272 is higher in an order of magnitude than the voltage applied to the low voltage signal line 271. In terms of volt units, the voltage applied to the high voltage signal line 272 is equal to or 10 times higher than the voltage applied to the low voltage signal line 271.

The wiring case 273 accommodates the low voltage signal line 271 and the high voltage signal line 272 having an extreme difference in the applied voltages. The connecting member 274 connects these two types of signal lines to the wiring case 273. The low voltage signal line 271 corresponds to the first insulated wire. The high voltage signal line 272 corresponds to the second insulated wire.

Figure 3:
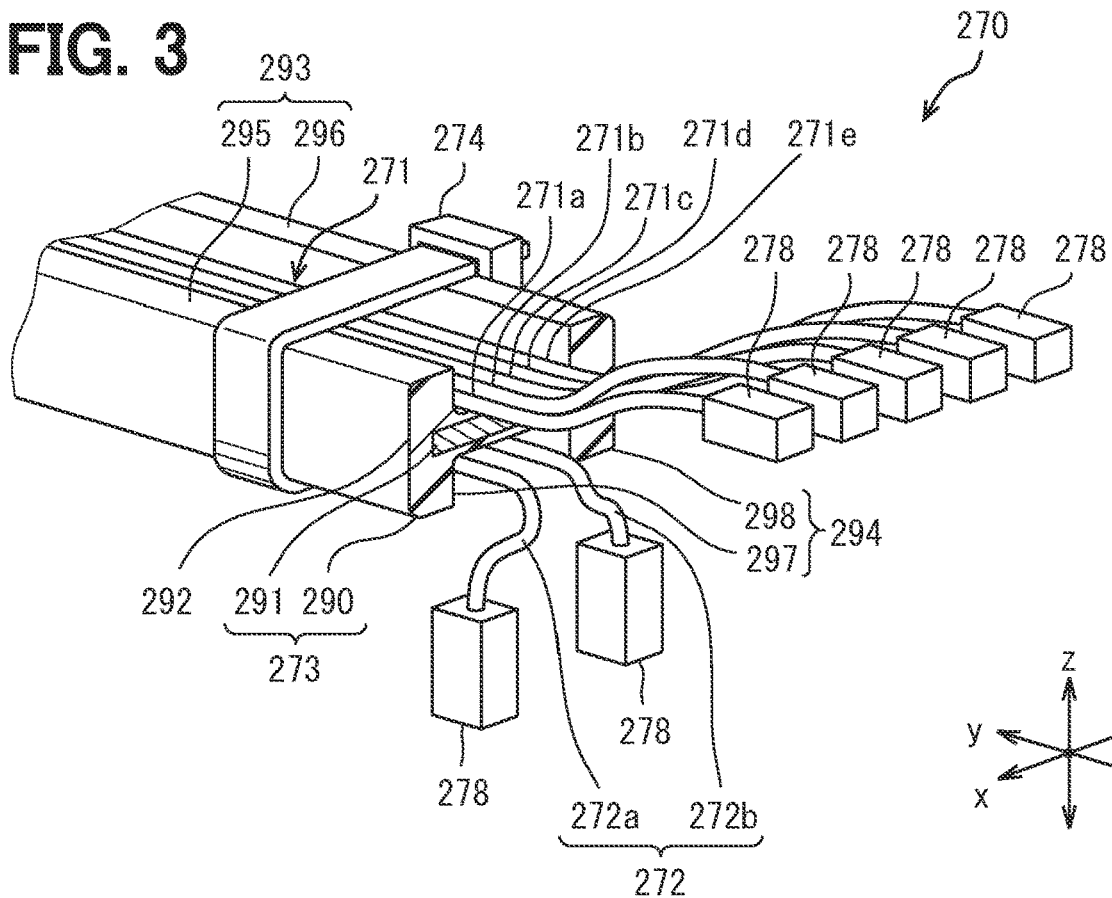
FIG. 3 is a perspective view for explaining a wiring module.
Figure 4:
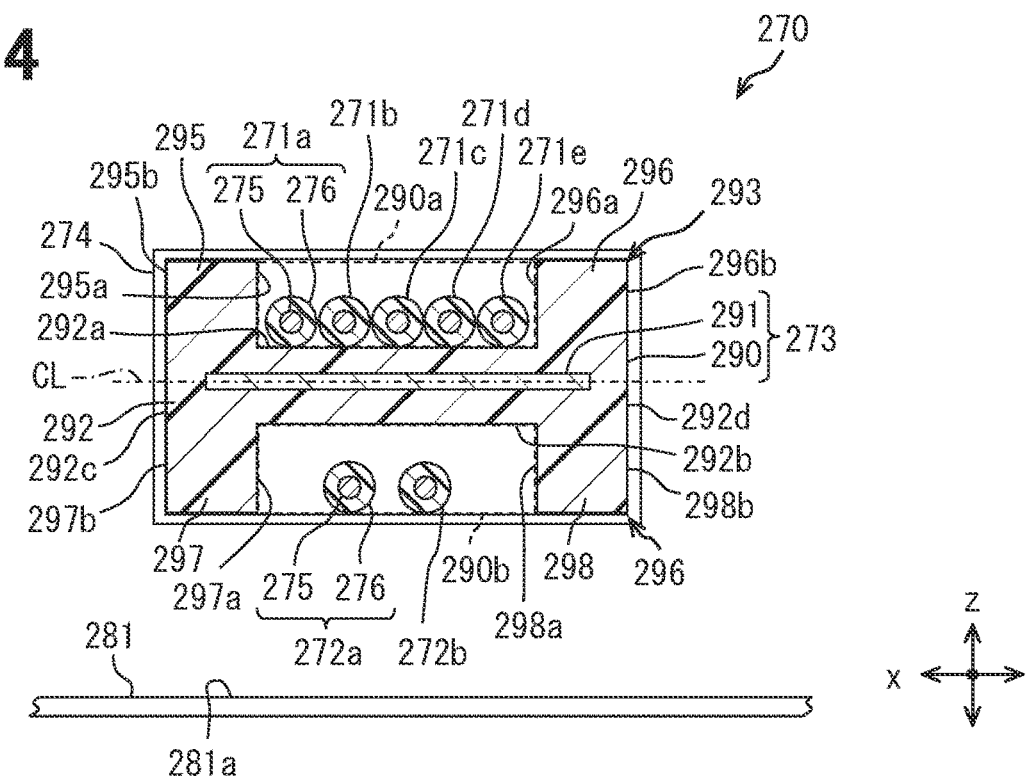
FIG. 4 is a cross-sectional view for explaining a wiring module.

<Low Voltage Signal Line> As shown in FIGS. 2 to 4, the low voltage signal line 271 includes a first relay signal line 271a, a second relay signal line 271b, a DC power connector signal line 271c, a front connector signal line 271d, and a rear connector signal line 271e. Further, the low voltage signal line 271 has a DCDC signal line 271f and an ACDC signal line 271g. In FIGS. 3 and 4, the DCDC signal line 271f and the ACDC signal line 271g are not shown. Further, in FIG. 4, a part of the bottom wall 281 is also shown in addition to the wiring module 270.

A first connector 277 is provided on one end of each of these signal lines, and a second connector 278 is provided on the other end of each of these signal lines. The first connector 277 of each of these signal lines is connected to the power distribution ECU 260. Then, as shown below, the second connector 278 of each signal line is connected to various components of the power distribution apparatus 200.

The second connector 278 provided on the other end of the first relay signal line 271a is connected to the DC relay 230 provided in the third positive electrode line 201c. The second connector 278 provided on the other end of the second relay signal line 271b is connected to the DC relay 230 provided in the third negative electrode line 202c. A drive signal is output from the power distribution ECU 260 to the DC relay 230 via each of the first relay signal line 271a and the second relay signal line 271b.

The low voltage signal line 271 has two DC power connector signal lines 271c. The other ends of these two DC power connector signal lines 271c are provided in one second connector 278. The second connector 278 is connected to the DC power connector 214. When the DC power source 700 is connected to the DC power supply connector 214, the other ends of the two DC power supply connector signal lines 271c are electrically connected. This constitutes a closed loop. As a resistance value between the two DC power connector signal lines 271c changes, a current flows through these two connector signal lines. As a result, the power distribution ECU 260 determines that the DC power source 700 is connected to the power distribution apparatus 200. Note that in FIGS. 3 and 4, one of the two DC power connector signal lines 271c is not shown.

A common signal line 218 is provided in the front connector 215 and the rear connector 216. One end of the common signal line 218 is provided in the front connector 215. The other end of the common signal line 218 is provided in the rear connector 216.

In the case that the second connector 278 provided on the other end of the front connector signal line 271d is connected to the front connector 215, the front connector 215 is provided with the other end of the front connector signal line 271d and one end of the common signal line 218. In the case that the front PCU 500 is connected to the front connector 215, the other end of the front connector signal line 271d and one end of the common signal line 218 are electrically connected.

In the case that the second connector 278 provided on the other end of the rear connector signal line 271e is connected to the rear connector 216, the rear connector 216 is provided with the other end of the rear connector signal line 271e and the other end of the common signal line 218. In the case that the rear PCU 600 is connected to the rear connector 216, the other end of the rear connector signal line 271e and the other end of the common signal line 218 are electrically connected.

The electrical connection constitutes a closed loop including the front connector signal line 271d and the rear connector signal line 271e. The resistance value between the front connector signal line 271d and the common signal line 218 changes, and the resistance value between the rear connector signal line 271e and the common signal line 218 changes. The resistance value between the front connector signal line 271d and the rear connector signal line 271e changes. Then, a current flows through these two connector signal lines. As a result, the power distribution ECU 260 determines that the front PCU 500 and the rear PCU 600 are connected to the power distribution apparatus 200.

The low voltage signal line 271 has a plurality of DCDC signal lines 271*f*. The second connector 278 provided on the other end of each of the plurality of DCDC signal lines 271*f* is connected to the DCDC converter 220. A drive signal is output from the power distribution ECU 260 to the DCDC converter 220 via the DCDC signal line 271*f*.

The low voltage signal line 271 has a plurality of ACDC signal lines 271*g*. The second connector 278 provided on the other end of each of these plurality of ACDC signal lines 271*g* is connected to the ACDC converter 250. A drive signal is output from the power distribution ECU 260 to the ACDC converter 250 via the ACDC signal line 271*g*.

As shown above, a current flows through the DC power connector signal line 271*c*, the front connector signal line 271*d*, and the rear connector signal line 271*e* due to the formation of a closed loop. A current for keeping the DC relay 230 closed flows through the first relay signal line 271*a* and the second relay signal line 271*b*. The current flowing through these signal lines is less likely to change over time.

On the other hand, the current flowing through the DCDC signal line 271*f* and the ACDC signal line 271*g* tends to change with time due to operation controls of the DCDC converter 220 and the ACDC converter 250. Therefore, electromagnetic noise is likely to be generated from the DCDC signal line 271*f* and the ACDC signal line 271*g*, and the DCDC converter 220 and the ACDC converter 250.

<High Voltage Signal Line> As shown in FIGS. 2 and 3, the high voltage signal line 272 has a first power signal line 272*a* and a second power signal line 272*b*. One of the first connector 277 common to each end of each of these two power signal lines is provided. The first connector 277 is connected to the power distribution ECU 260.

As shown in FIG. 3, the second connector 278 is provided on the other end of each of the first power signal line 272*a* and the second power signal line 272*b*. The second connector 278 provided on the other end of the first power signal line 272*a* is connected between the DC relay 230 and the DC power supply connector 214 in the third positive electrode line 201*c*. The second connector 278 provided on the other end of the second power signal line 272*b* is connected between the DC relay 230 and the DC power supply connector 214 in the third negative electrode line 202*c*. In FIG. 2, the second connector 278 is not shown in order to clearly indicate the electrical connection location between the power signal line and the power line.

As described above, the power distribution ECU 260 turns on the DC relay 230 when the DC power source 700 is connected to the power distribution apparatus 200 in in a parked or stopped condition during the DC charging. The power distribution ECU 260 turns off the DC relay 230 except during the DC charging.

Therefore, it is expected that a voltage corresponding to the DC power of the DC power source 700 is applied to the first power signal line 272*a* and the second power signal line 272*b* during the DC charging. It is expected that no significant potential difference is occur between the first power signal line 272*a* and the second power signal line 272*b* except during the DC charging.

The power distribution ECU 260 measures the voltage of the DC power supplied from the DC power source 700 based on the potential difference between the first power signal line 272*a* and the second power signal line 272*b* during the DC charging. The power distribution ECU 260 determines whether or not an electric leakage has occurred between the positive line and the negative line based on the potential difference between the first power signal line 272*a* and the second power signal line 272*b* except during the DC charging.

A location of the connection of the power signal line is not limited to the above example as long as the occurrence of electric leakage between the positive line and the negative line is merely detected. For example, the first power signal line 272*a* may be connected to one end side of the first power line 201. The second power signal line 272*b* may be connected to one end side of the second power line.

<Arrangement of Low Voltage Signal Lines> As described with reference to FIG. 2, various components of the power distribution apparatus 200 are arranged apart from each other in the x-direction and the y-direction. Due to this arrangement and configuration, the first relay signal line 271*a*, the second relay signal line 271*b*, and the DC power connector signal line 271*c* are located on a side to the right wall 284 in the x-direction, and is extended to a side to the front wall 285 from the distribution ECU 260. The front connector signal line 271*d* and the rear connector signal line 271*e* are located on a side to the right wall 284 in the x-direction and are extended to a side to the rear wall 286 from the power distribution ECU 260.

Further, the DCDC signal line 271*f* and the ACDC signal line 271*g* are extended to a side to the left wall 283 from the power distribution ECU 260.

Due to this arrangement and configuration, as shown by solid arrows in FIG. 2, the first relay signal line 271*a*, the second relay signal line 271*b*, and the DC power connector signal line 271*c* are separated from the ACDC signal line 271*g* and the DCDC signal line 271*f*. Similarly, the front connector signal line 271*d* and the rear connector signal line 271*e* are separated from the DCDC signal line 271*f* and the ACDC signal line 271*g*.

Furthermore, the first relay signal line 271*a*, the second relay signal line 271*b*, the DC power connector signal line 271*c*, the front connector signal line 271*d*, and the rear connector signal line 271*e* are separated from the ACDC converter 250 and the DCDC converter 220. Further, the first power signal line 272*a* and the second power signal line 272*b* included in the high voltage signal line 272 are also separated from the DCDC signal line 271*f* and the ACDC signal line 271*g*, and also separated from the ACDC converter 250 and the DCDC converter 220.

<Wiring Case> The wiring case 273 has a main body member 290 made of an insulating resin material and a shield member 291 having a high magnetic permeability embedded in the main body member 290. The main body member 290 has a shape that extends in accordance with a wiring arrangement of the low voltage signal line 271 and the high voltage signal line 272 in the housing 280. Although not illustrated, the main body member 290 is formed with a plurality of notches for pulling out one end side and the other end side of each signal line to the outside of the main body member 290.

FIG. 3 shows a portion of the main body member 290 extending in the y-direction and its cross-sectional shape. The first relay signal line 271*a*, the second relay signal line 271*b*, the DC power connector signal line 271*c*, the front connector signal line 271*d*, and the rear connector signal line 271*e* are accommodated in a portion extending in the y-direction of the main body member 290. Further, the first power signal line 272*a* and the second power signal line 272*b* are accommodated in the portion extending in the y-direction of the main body member 290. Although not shown, the DCDC signal line 271f and the ACDC signal line 271g are accommodated in other parts of the main body member 290.

As shown in FIG. 4, the cross-sectional shape orthogonal to a longitudinal direction of the main body member 290 has a shape having a first groove portion 290a and a second groove portion 290b in which the opening direction is opposite in the z-direction. These grooves extend in the longitudinal direction. In FIG. 4, these grooves are surrounded by broken lines.

In detail, the main body member 290 has a base portion 292, an upper portion 293, and a lower portion 294. The base portion 292 has an upper surface 292a and a lower surface 292b arranged apart from each other in the z-direction. The base portion 292 has a first side surface 292c and a second side surface 292d extending in the longitudinal direction of the main body member 290 while connecting the upper surface 292a and the lower surface 292b. The base portion 292 corresponds to an insulating member.

The upper side portion 293 has a first upper side portion 295 which protrudes from the upper surface 292a in the z-direction at a side to the first side surface 292c, and a second upper side portion 296 which protrudes from the upper surface 292a in the z-direction at a side to the second side surface 292d. These two upper portions extend in the longitudinal direction. A length of these two upper portions in the z-direction is longer than a length (diameter) of the low voltage signal line 271 and the high voltage signal line 272 in the z-direction.

The first upper side portion 295 has a first upper inner side surface 295a on a side to the center of the base portion 292 and a first upper outer side surface 295b on a back side thereof. The second upper side portion 296 has a second upper inner side surface 296a on a side to the center of the base portion 292 and a second upper outer side surface 296b on a back side thereof.

The first upper inner side surface 295a and the second upper inner side surface 296a are separated from and still faces each other. The first groove portion 290a is defined by the first upper inner side surface 295a, the second upper inner side surface 296a, and the upper surface 292a. The opening of the first groove portion 290a in the z-direction is defined on distal end sides of the first upper portion 295 and the second upper portion 296 distanced from the base portion 292. The upper surface 292a corresponds to the first arrangement surface.

The low voltage signal line 271 is accommodated in the first groove portion 290a. In the example shown in FIGS. 3 and 4, the first groove portion 290a accommodates the first relay signal line 271a, the second relay signal line 271b, the DC power connector signal line 271c, the front connector signal line 271d, and the rear connector signal line 271e.

In this embodiment, the first upper outer surface 295b of the first upper portion 295 is continuous to the first side surface 292c of the main body member 290. Similarly, the second upper outer surface 296b of the second upper side portion 296 is continuous to the second side surface 292d of the main body member 290.

The lower side portion 294 has a first lower side portion 297 which protrudes from the lower surface 292b in the z-direction at a side to the first side surface 292c, and a second lower side portion 298 which protrudes from the lower surface 292b in the z-direction at a side to the second side surface 292d. These two lower portions protrude apart from the two upper portions in the z-direction. These two lower portions extend in the longitudinal direction. The length of these two lower portions in the z-direction is longer than the length of the low voltage signal line 271 and the high voltage signal line 272 in the z-direction.

The first lower side portion 297 has a first lower inner side surface 297a on a side to the center of the base portion 292, and a first lower outer side surface 297b on a back side thereof. The second lower side portion 298 has a second lower inner side surface 298a on a side to the center of the base portion 292 and a second lower outer side surface 298b on a back side thereof.

The first lower inner side surface 297a and the second lower inner side surface 298a are separated from and still faces each other. The second groove portion 290b is defined by the first lower inner side surface 297a, the second lower inner side surface 298a, and the lower surface 292b. The opening of the second groove portion 290b in the z-direction is defined on distal end sides of the first lower portion 297 and the second lower portion 298 distanced from the base portion 292. The lower surface 292b corresponds to the second arrangement surface.

The first power signal line 272a and the second power signal line 272b of the high voltage signal line 272 are accommodated in the second groove portion 290b.

In this embodiment, the first lower outer surface 297b of the first lower portion 297 is continuous to the first side surface 292c of the main body member 290. Similarly, the second lower outer surface 298b of the second lower side portion 298 is continuous to the second side surface 292d of the main body member 290.

The shield member 291 is manufactured of a material having a higher magnetic permeability than the main body member 290. As the forming material of the shield member 291, a metal material such as copper can be adopted. The shield member 291 corresponds to a high magnetic permeability member.

As shown in FIG. 4, the shield member 291 is embedded in an inside between the upper surface 292a and the lower surface 292b in the base portion 292. The shield member 291 has a flat shape with a thin thickness in the z-direction. The shield member 291 extends in the longitudinal direction of the main body member 290.

A center line CL, which passes through the center of the base portion 292 and is along the plane orthogonal to the z-direction, is shown by an alternate long and short dash line in FIG. 4. The shield member 291 is located at this center line CL. A thickness between the shield member 291 and the upper surface 292a in the base portion 292 is equal to a thickness between the shield member 291 and the lower surface 292b.

Further, a side of the shield member 291 to the first side surface 292c is located between the first upper portion 295 and the first lower side portion 297 in the z-direction. At the same time, a side of the shield member 291 to the second side surface 292d is located between the second upper portion 296 and the second lower side portion 298 in the z-direction.

Due to the configuration shown above, in a housed condition within the wiring case 273, the base portion 292 made of an insulating material and the shield member 291 having a high magnetic permeability are interposed between the low voltage signal line 271 and the high voltage signal line 272. The base portion 292 and the shield member 291 are included in the intervening member.

The lower portion 294 may not be formed in the non-accommodating portion of the first power signal line 272a and the second power signal line 272b in the main body member 290. Further, the shield member 291 may not be embedded in the non-formed portion of the lower portion 294 in the main body member 290.

<Connecting member> The connecting member 274 is made of an insulating resin material. As shown in FIGS. 3 and 4, the connecting member 274 extends in a circumferential direction around the longitudinal direction of the main body member 290. The connecting member 274 has a shape extending in an annular shape without a break in the circumferential direction. A part of each opening of the first groove portion 290a and the second groove portion 290b of the main body member 290 is covered by the connecting member 274. At least one of the connecting member 274 is provided in the main body member 290. Specifically, as the connecting member 274, a cable tie or an annular rubber band may be adopted.

By providing the connecting member 274 in the main body member 290 as described above, it is possible to prevent the low voltage signal line 271 provided in the first groove portion 290a from moving out of the first groove portion 290a. The high voltage signal line 272 provided in the second groove portion 290b is suppressed from moving out of the second groove portion 290b.

<Arrangement of Wiring Modules> The wiring module 270 is accommodated in the housing 280 together with the power distribution ECU 260. In this accommodated state, the first groove portion 290a of the main body member 290 included in the wiring module 270 is arranged on the opening side of the housing 280. As shown in FIG. 4, the second groove portion 290b is arranged on a side to the inner bottom surface 281a of the bottom wall 281 of the housing 280.

Due to this arrangement and configuration, the lower surface 292b defining a part of the second groove portion 290b is separated from and still faces the inner bottom surface 281a in the z-direction. The high voltage signal line 272 accommodated in the second groove portion 290b is surrounded by the first lower inner side surface 297a, the second lower inner side surface 298a, the lower surface 292b, and the inner bottom surface 281a of the bottom wall 281 which define the second groove portion 290b.

In the case that the vehicle is parked on the horizontal plane, the z-direction is along the vertical direction. The first groove portion 290a is located above the second groove portion 290b in the vertical direction. Therefore, as shown in FIG. 4, the low voltage signal line 271 accommodated in the first groove portion 290a is located on a side to the upper surface 292a which defines a part of the first groove portion 290a in the z-direction. The high voltage signal line 272 housed in the second groove portion 290b is located on a side to the opening of the second groove portion 290b in the z-direction. The high voltage signal line 272 is separated from and still faces the lower surface 292b in the z-direction, which defines a part of the second groove portion 290b, and is supported by the connecting member 274.

<Operation and Advantage> As described above, the low voltage signal line 271 and the high voltage signal line 272 are connected to the power distribution ECU 260. These two signal lines having different applied voltages are accommodated in the wiring module 270. The base portion 292 having an insulating property is interposed between two signal lines.

According to this, it is possible to suppress an occurrence of leakage current due to a direct contact of the conductive wirings 275 of the low voltage signal line 271 and the high voltage signal line 272 with damaged insulation films 276 respectively. It is possible to suppress a flow of unintentional current through the power distribution ECU 260 by a leakage. It is possible to suppress an influence on running of the electric vehicle due to a damage in the power distribution ECU 260 by an unintentional current flow.

Both the shield member 291 having a high magnetic permeability and the base portion 292 having an insulating property are interposed between the low voltage signal line 271 and the high voltage signal line 272.

According to this, the electromagnetic noise generated in the high voltage signal line 272 applied with a high voltage is suppressed from passing through the low voltage signal line 271. As a result, it is possible to prevent the arithmetic processing in the power distribution ECU 260 based on the signal input via the low voltage signal line 271 from becoming inappropriate.

The shield member 291 is embedded in an inside between the upper surface 292a and the lower surface 292b of the base portion 292.

According to this, it is possible to suppress a direct contact between the shield member 291 and the conductive wiring 275 of the low voltage signal line 271 and the high voltage signal line 272 with damaged insulation films 276 respectively. It is suppressed that the high voltage signal line 272 and the low voltage signal line 271 are electrically connected via the shield member 291.

The first groove portion 290a of the main body member 290 is arranged on a side to the opening of the housing 280, and the second groove portion 290b is arranged on a side to the inner bottom surface 281a of the bottom wall 281. The high voltage signal line 272 is provided between the base portion 292 and the bottom wall 281.

According to this, for example, a user of a vehicle who has tried to insert a hand from the opening of the housing 280 into the inside thereof is prevented from touching the high voltage signal line 272 having a high applied voltage. The z-direction corresponds to the connecting direction.

In the case that the vehicle is stopped on the horizontal plane, the low voltage signal line 271 is located on a side to the upper surface 292a in the z-direction, and the high voltage signal line 272 is located on a side to the opening of the second groove portion 290b. As a result, the low voltage signal line 271 and the high voltage signal line 272 are separated from each other. Therefore, the electromagnetic noise generated in the high voltage signal line 272 is suppressed from passing through the low voltage signal line 271.

The first relay signal line 271a, the second relay signal line 271b, the DC power connector signal line 271c, the front connector signal line 271d, and the rear connector signal line 271e are separated from the DCDC signal line 271f and the ACDC signal line 271g.

According to this, the electromagnetic noise generated from the drive signal input to the DCDC signal line 271f and the ACDC signal line 271g is suppressed from passing through the signal line separated from them.

Further, as shown in FIG. 2, the first relay signal line 271a, the second relay signal line 271b, and the DC power connector signal line 271c are separated from the DCDC converter 220 and the ACDC converter 250. Similarly, the front connector signal line 271d and the rear connector signal line 271e are separated from the DCDC converter 220 and the ACDC converter 250.

According to this, the electromagnetic noise generated by the DCDC converter 220 and the ACDC converter 250 is suppressed from passing through the signal lines separated from them.

First Modification

In this embodiment, for example, as schematically shown in FIG. 2, an example is shown in which the wiring module 270 is not opposed to each of the DCDC converter 220 and the ADCC converter 250 in the z-direction. However, it is also possible to adopt a configuration in which the wiring module 270 faces at least one of the DCDC converter 220 and the ADCC converter 250 in the z-direction.

Figure 5:
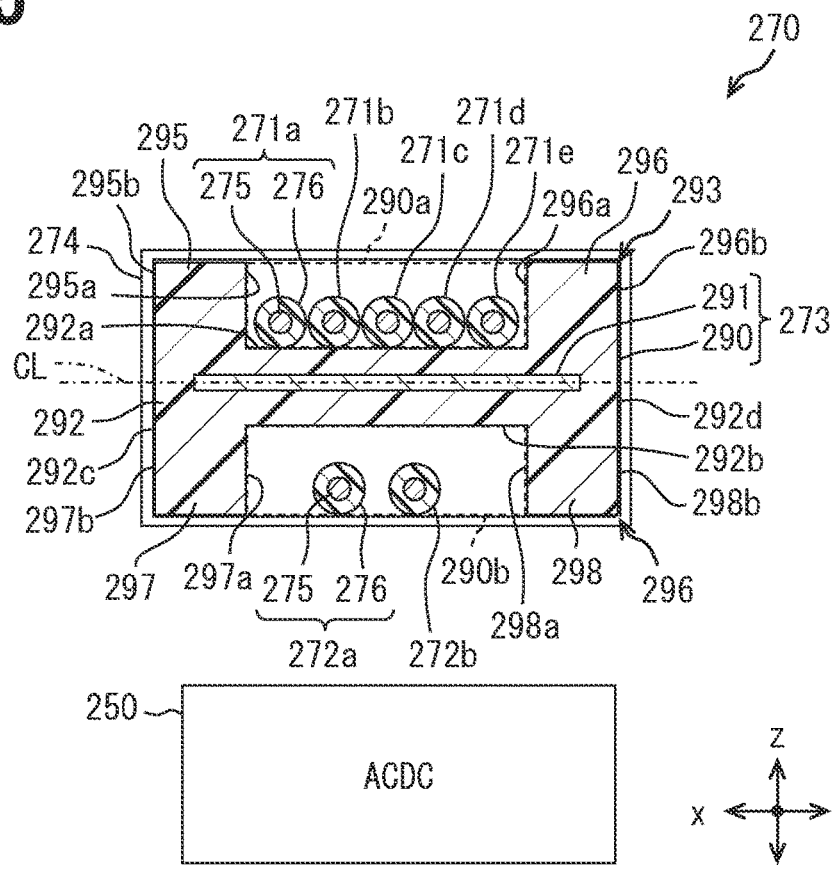
FIG. 5 is a cross-sectional view for explaining a modified example of the wiring module.

In the case of this modification, for example, as shown in FIG. 5, it is possible to adopt a configuration in which the low voltage signal line 271 is more separated from the ADCC converter 250 than the high voltage signal line 272. As a result, the electromagnetic noise generated by the ACDC converter 250 is suppressed from passing through the low voltage signal line 271.

Further, although not shown, it is possible to adopt a configuration in which the low voltage signal line 271 is more separated from the DCDC converter 220 than the high voltage signal line 272. According to this, the electromagnetic noise generated in the DCDC converter 220 is suppressed from passing through the low voltage signal line 271.

Second Modification

Figure 6:
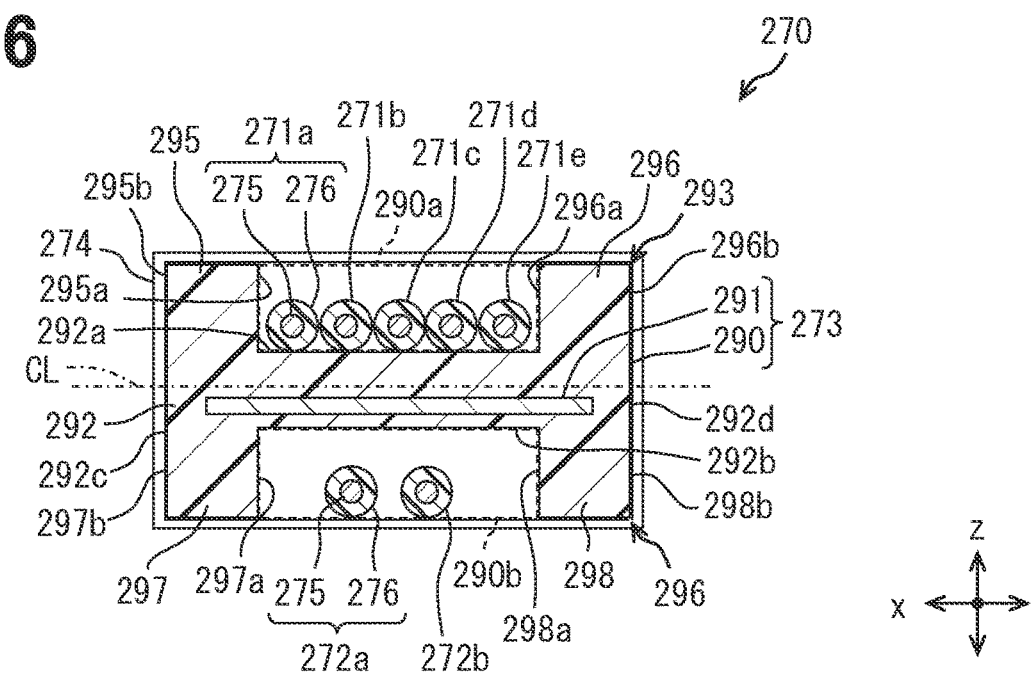
FIG. 6 is a cross-sectional view for explaining a modified example of the wiring module.

In the present embodiment, an example is shown in which the shield member 291 is located on the center line CL, which passes through the center of the base portion 292 and is along the plane orthogonal to the z-direction. However, for example, as shown in FIG. 6, it is also possible to adopt a configuration in which the entire shield member 291 is located on a side to the lower surface 292b more than the center line CL.

According to this, the separation distance between the shield member 291 and the high voltage signal line 272 is narrowed. Therefore, the electromagnetic noise generated in the high voltage signal line 272 can be positively transmitted to the shield member 291. As a result, electromagnetic noise is suppressed from passing through the low voltage signal line 271.

Third Modification

Figure 7:
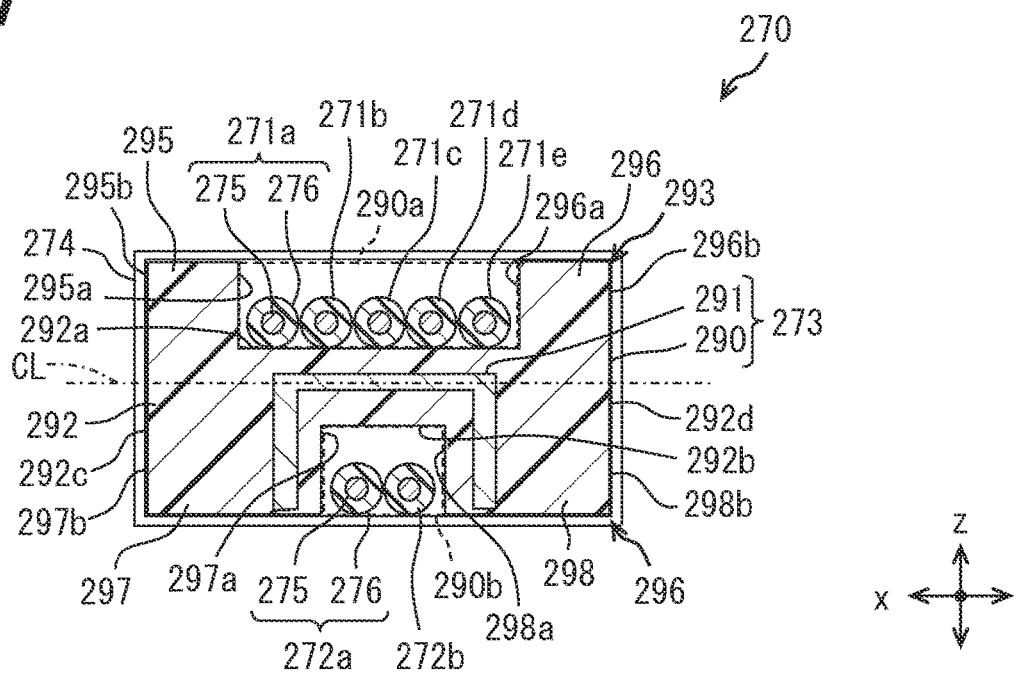
FIG. 7 is a cross-sectional view for explaining a modified example of the wiring module.

In this embodiment, an example is shown in which the shield member 291 is embedded only in an inside of the base portion 292. However, it is also possible to adopt a configuration in which the shield member 291 is embedded not only in the base portion 292 but also in at least one of the upper portion 293 and the lower portion 294. For example, as shown in FIG. 7, it is possible to adopt a configuration in which the shield member 291 is embedded in an inside of the base portion 292 and the lower portion 294.

According to this, the shield member 291 surrounds the low voltage signal line 271. Therefore, the electromagnetic noise generated in the high voltage signal line 272 is suppressed from flowing toward the first groove portion 290a.

Although not shown, it is possible to adopt a configuration in which the shield member 291 is embedded in an inside of the base portion 292 and the upper portion 293. According to this, the shield member 291 surrounds the low voltage signal line 271. Therefore, it is suppressed that electromagnetic noise passes through the low voltage signal line 271.

Further, it is also possible to adopt a configuration in which the shield member 291 is embedded in an each inside of the base portion 292, the upper portion 293, and the lower portion 294. It is also possible to adopt a configuration in which the shield member 291 is embedded in the main body member 290 and a part thereof is exposed from the main body member 290.

In the modified example shown in FIG. 7, in the upper portion 293, a separated distance between the first upper portion 295 and the second upper portion 296 is narrower than a separated distance between the first lower portion 297 and the second lower portion 298. In this way, the separation distance of each side portion may be determined according to the number of signal lines to be accommodated.

Fourth Modification

In this embodiment, an example is shown in which the shield member 291 is embedded in an inside of the base portion 292 However, it is also possible to adopt a configuration in which the shield member 291 is formed on a surface of the main body member 290. For example, a forming material (metal material) of the shield member 291 may be formed on a surface of the main body member 290 by vapor deposition.

Figure 8:
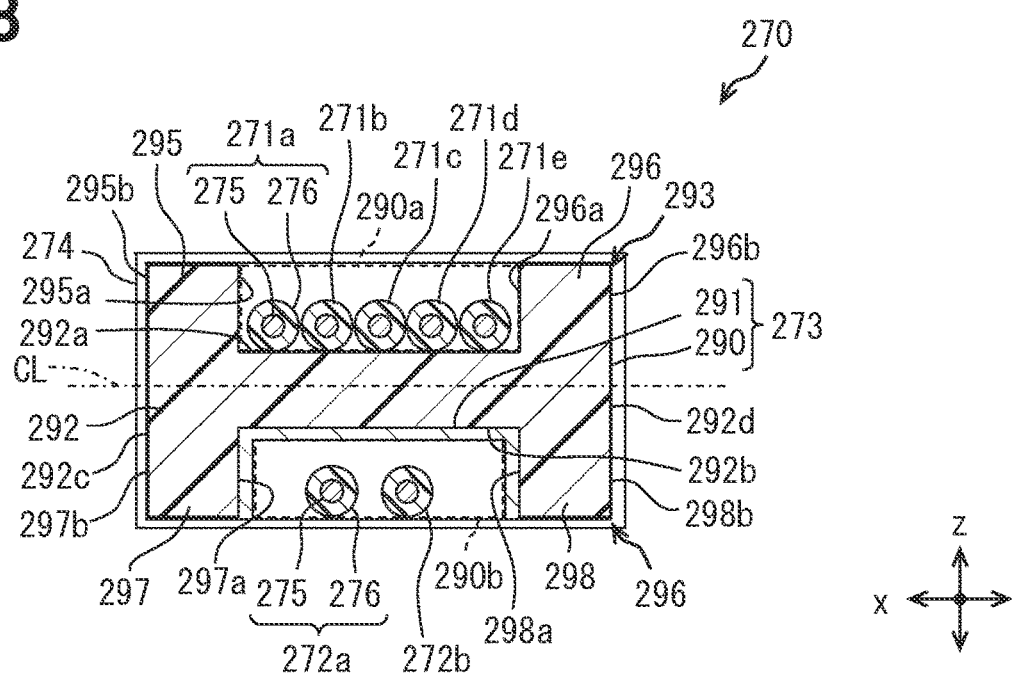
FIG. 8 is a cross-sectional view for explaining a modified example of the wiring module.

As shown in FIG. 8, for example, it is possible to adopt a configuration in which the shield member 291 is provided on the first lower inner side surface 297a, the second lower inner side surface 298a, and the lower surface 292b which define the second groove portion 290b. In this modification, at least a part of the second groove portion 290b is defined by the shield member 291.

According to this, the separation distance between the shield member 291 and the low voltage signal line 271 is narrowed, and the shield member 291 surrounds the low voltage signal line 271. Therefore, it is effectively suppressed that the electromagnetic noise generated in the high voltage signal line 272 flows toward the first groove portion 290a.

Although not shown, it is also possible to adopt a configuration in which the shield member 291 is provided on the first upper inner side surface 295a, the second upper inner side surface 296a, and the upper surface 292a which define the first groove portion 290a. According to this, the separation distance between the shield member 291 and the low voltage signal line 271 is narrowed, and the shield member 291 surrounds the low voltage signal line 271. Therefore, it is effectively suppressed that electromagnetic noise passes through the low voltage signal line 271.

In the case that the shield member 291 is provided on the surface of the main body member 290 as described in this modification, it is sufficient that the shield member 291 is provided on at least one of the upper surface 292a and the lower surface 292b.

Further, it is also possible to adopt a configuration in which a part of the shield member 291 is embedded in an inside of the main body member 290 and the remaining part of the shield member 291 is formed on a surface of the main body member 290.

Fifth Modification

In this embodiment, an example is shown in which the wiring module 270 has the shield member 291. However, for example, as shown in FIGS. 7 and 8, the wiring module 270 does not have to have the shield member 291.

Sixth Modification

Figure 9:
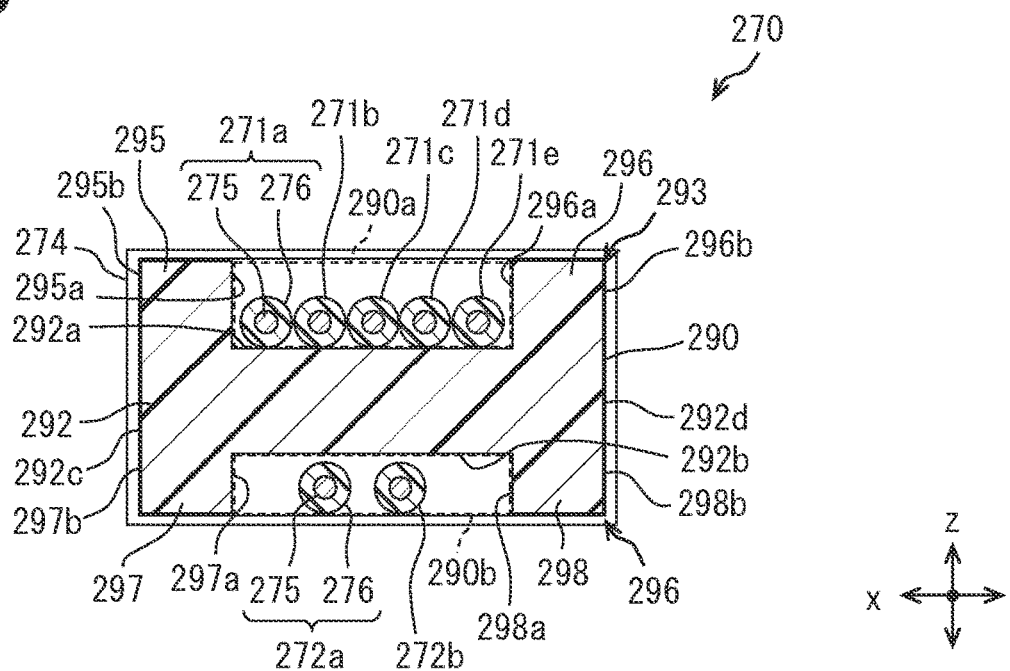
FIG. 9 is a cross-sectional view for explaining a modified example of the wiring module.

In this embodiment, for example, as shown in FIG. 4, an example is shown in which the upper portion 293 and the lower portion 294 have the same length in the z-direction. However, the lengths of the upper portion 293 and the lower portion 294 in the z-direction may be different. For example, as shown in FIG. 9, it is possible to adopt a configuration in which a length of the lower portion 294 in the z-direction is shorter than the upper portion 293.

Seventh Modification

Figure 10:
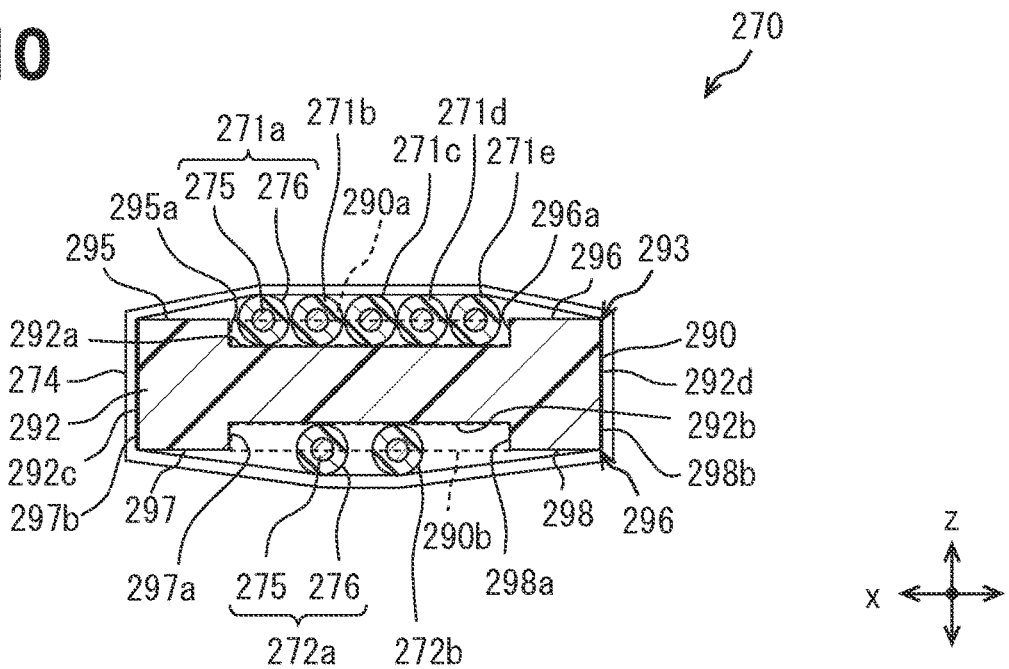
FIG. 10 is a cross-sectional view for explaining a modified example of the wiring module.

In this embodiment, for example, as shown in FIG. 4, an example is shown in which the lengths of the upper portion 293 and the lower portion 294 in the z-direction are longer than the length (diameter) of the low voltage signal line 271 and the high voltage signal line 272 in the z-direction. However, it is also possible to adopt a configuration in which the length of at least one of the upper portion 293 and the lower portion 294 in the z-direction is shorter than the length of the low voltage signal line 271 and the high voltage signal line 272 in the z-direction. For example, as shown in FIG. 10, it is possible to adopt a configuration in which the lengths of the upper portion 293 and the lower portion 294 in the z-direction are shorter than the lengths of the low voltage signal line 271 and the high voltage signal line 272 in the z-direction.

Eighth Modification

Figure 11:
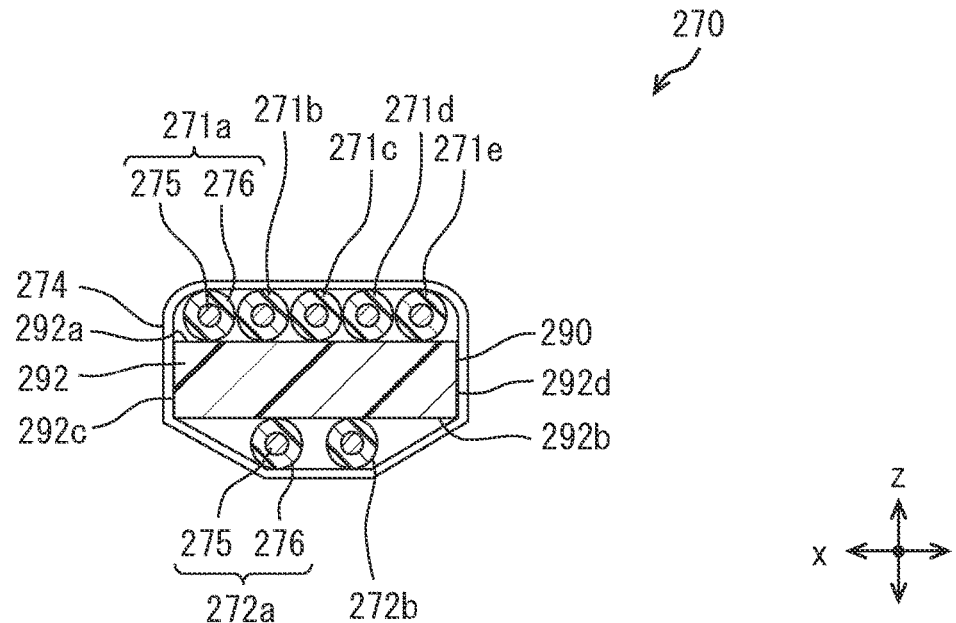
FIG. 11 is a cross-sectional view for explaining a modified example of the wiring module.

In this embodiment, an example is shown in which the main body member 290 has the base portion 292, the upper portion 293, and the lower portion 294. However, the main body member 290 may include the base portion 292, and may not include at least one of the upper portion 293 and the lower portion 294. For example, as shown in FIG. 11, it is possible to adopt a configuration in which the main body member 290 includes only the base portion 292.

Ninth Modification

Figure 12:
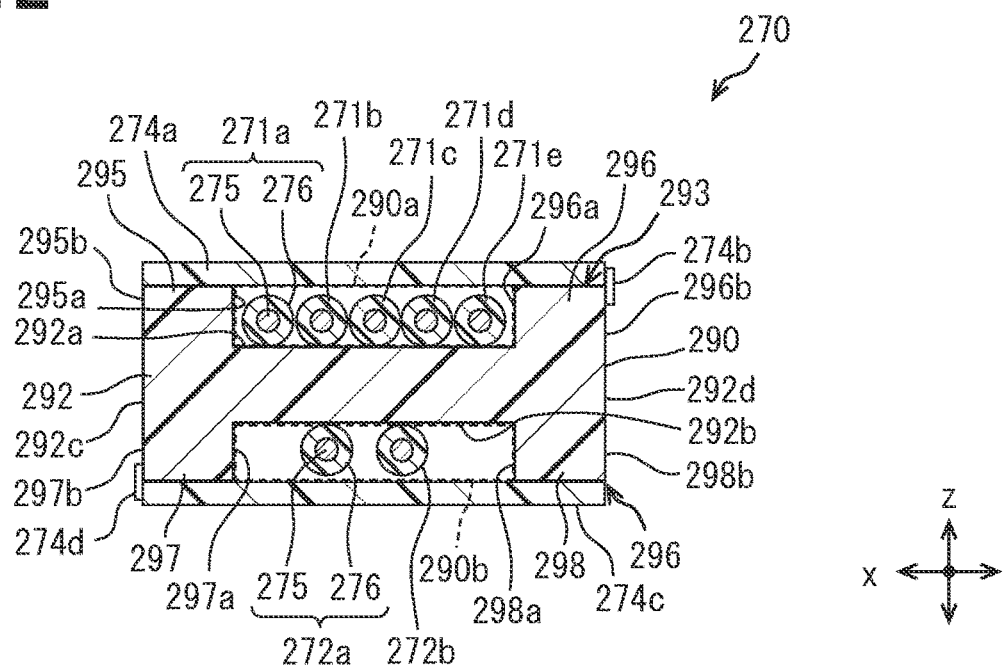
FIG. 12 is a cross-sectional view for explaining a modified example of the wiring module.

In the present embodiment, an example is shown in which the connecting member 274 is the cable tie or the annular rubber band extending in an annular shape without a break in the circumferential direction around the longitudinal direction of the main body member 290. However, the connecting member 274 is not limited to this embodiment. For example, it is possible to adopt the connecting member 274 in the form shown in FIG. 12.

The connecting member 274 has the upper lid portion 274a and the upper hinge portion 274b, and the lower lid portion 274c and the lower hinge portion 274d. The upper lid portion 274a is connected to the upper portion 293 by the upper hinge portion 274b. The upper lid portion 274a is rotatable around the upper hinge portion 274b. The upper lid portion 274a is movable around the upper hinge portion 274b in a manner that close to and far from the opening of the first groove portion 290a. In the case that the upper lid portion 274a comes into contact with the upper end surfaces of the first upper portion 295 and the second upper portion 296 included in the upper portion 293, the opening of the first groove portion 290a is closed by the upper lid portion 274a.

Similarly, the lower lid portion 274c is connected to the lower portion 294 by the lower hinge portion 274d. The lower lid portion 274c is rotatable around the lower hinge portion 274d. The lower lid portion 274c is movable around the lower hinge portion 274d in a manner that close to and far from the opening of the second groove portion 290b. In the case that the lower lid portion 274c comes into contact with the lower end surfaces of the first lower side portion 297 and the second lower side portion 298 included in the lower side portion 294, the lower lid portion 274c closes opening of the second groove portion 290b.

Tenth Modification

In the present embodiment, an example is shown in which the main body member 290 has the base portion 292, the upper portion 293 connected to the upper surface 292a of the base portion 292, and the lower portion 294 connected to the lower surface portion 292b of the base portion 292. An example is shown in which the upper portion 293 has the first upper portion 295 and the second upper portion 296 which are separated on the upper surface 292a and form the first groove portion 290a between them. An example is shown in which the lower side portion 294 has the first lower side portion 297 and the second lower side portion 298 which are separated on the lower surface 292b and form the second groove portion 290b between them. That is, an example is shown in which the groove portion accommodating the low voltage signal line 271 is formed on a side of the upper surface 292a, and the groove portion accommodating the high voltage signal line 272 is formed on a side of the lower surface 292b.

Figure 13:
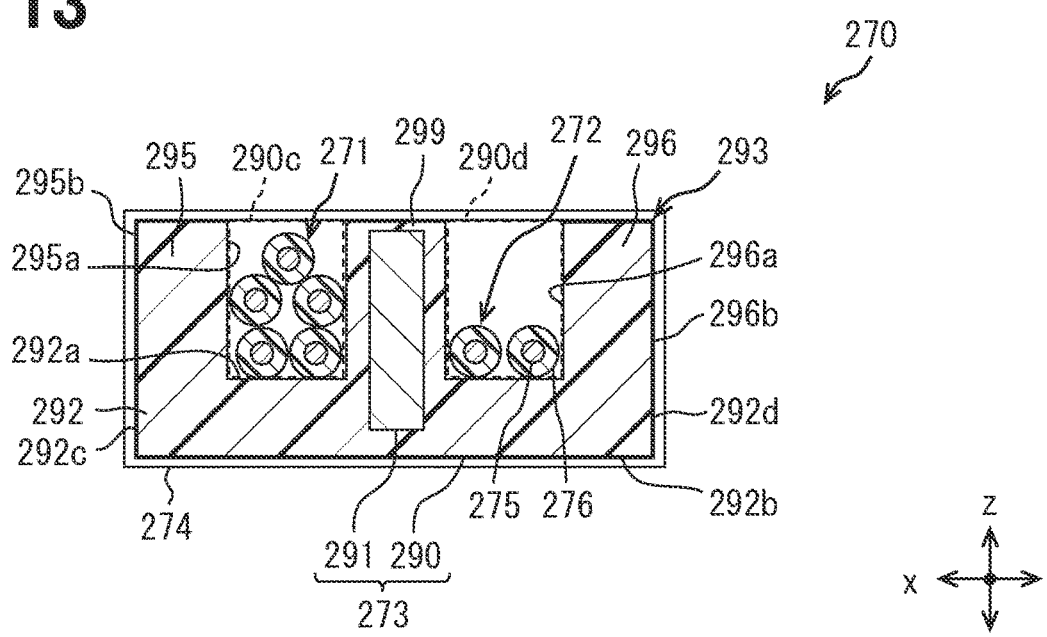
FIG. 13 is a cross-sectional view for explaining a modified example of the wiring module.

However, a groove for accommodating the low voltage signal line 271 and a groove for accommodating the high voltage signal line 272 may be formed on either a side of the upper surface 292a or a side of the lower surface 292b. For example, as shown in FIG. 13, a third groove portion 290c and a fourth groove portion 290d may be configured on the upper surface 292a.

The main body member 290 of this modification has the base portion 292, the upper portion 293 connected to the upper surface 292a of the base portion 292, and the intervening wall 299 connected to the upper surface 292a similar to the upper portion 293. The intervening wall 299 is located between the first upper portion 295 and the second upper portion 296 of the upper portion 293. The third groove portion 290c is formed between the first upper portion 295 and the intervening wall 299 on the upper surface 292a. The fourth groove portion 290d is formed between the intervening wall 299 and the second upper portion 296 on the upper surface 292a.

The low voltage signal line 271 is accommodated in the third groove portion 290c, and the high voltage signal line 272 is accommodated in the fourth groove portion 290d. The shield member 291 is embedded in the intervening wall 299 and the base portion 292. According to such a configuration, it is possible to suppress an occurrence of electric leakage due to a direct contact between the conductive wirings 275 of the low voltage signal line 271 and the high voltage signal line 272 with damaged insulation films 276 respectively. At the same time, the electromagnetic noise generated in the high voltage signal line 272 is suppressed from passing through the low voltage signal line 271. In this modification, the intervening wall 299 corresponds to the insulating member. The intervening wall 299 and the shield member 291 are included in the intervening member.

Eleventh Modification

In this embodiment and the modified examples described so far, examples are shown in which the forming material of the main body member 290 is the insulating resin material. However, it is possible to adopt the main body member 290 made of the forming material of a metal material.

Twelfth Modification

In this embodiment and the modified examples described so far, examples in which the shield member 291 is locally embedded in the main body member 290 are shown. However, it is also possible to adopt a configuration in which the main body member 290 contains a shield member 291 made of conductive filler having a high magnetic permeability. As described above, it is also possible to adopt a configuration in which a plurality of minute shield members 291 are uniformly embedded in the main body member 290.

Thirteenth Modification

In this embodiment and the modifications described so far, examples are shown in which the DCDC signal line 271f and the ACDC signal line 271g are separated from other signal lines. However, it is also possible to adopt a configuration in which the DCDC signal line 271f and the ACDC signal line 271g are not separated from other signal lines.

For example, it is possible to adopt a configuration in which the DCDC signal line 271f and the ACDC signal line 271g are provided in the same path of the first groove portion 290a together with at least one of the other signal line included in the low voltage signal line 271. The other signal line included in the low voltage signal line 271 may be the first relay signal line 271a, the second relay signal line 271b, the DC power connector signal line 271c, the front connector signal line 271d, and the rear connector signal line 271e.

Other Modifications

In the present embodiment, an example, in which the vehicle is provided with both the front MG 510 and the rear MG 610, is shown. However, it is also possible to adopt a configuration in which the system is provided with only one of MG among the front MG 510 and the rear MG 610. When only one of these two MGs is provided in the system, the system is provided with only one MG of the front MG 510 or the rear MG 610.

Although the present disclosure has been described in accordance with examples, it is understood that the present disclosure is not limited to the examples and structures. The present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A wiring module, comprising:
   a first insulated wire and a second insulated wire, wherein an applied voltage of the second insulated wire is higher than an applied voltage of the first insulated wire, the first insulated wire and the second insulated wire each electrically connected to a control unit which performs controls for charging and discharging of an in-vehicle power source;
   an intervening member which is interposed between the first insulated wire and the second insulated wire; and
   a connecting member which retains contact between the first insulated wire and the insulated member, and between the second insulated wire and the intervening member, wherein:
   the intervening member includes:
      an insulating member having an insulating characteristic; and
      a high magnetic permeability member having a higher magnetic permeability than the insulating member,
   the high magnetic permeability member is provided between a first arrangement surface of the insulating member and a second arrangement surface of the insulating member, the first arrangement surface of the insulating member being a surface where the first insulated wire is arranged, and the second arrangement surface of the insulating member being a surface where the second insulated wire is arranged, and
   the high magnetic permeability member is located closer to the second arrangement surface than to the first arrangement surface.

2. The wiring module claimed in claim 1, wherein the high magnetic permeability member is a shield member configured to suppress an electromagentic noise.

* * * * *